United States Patent
Fan et al.

(10) Patent No.: US 11,049,697 B2
(45) Date of Patent: Jun. 29, 2021

(54) SINGLE BEAM PLASMA SOURCE

(71) Applicants: Board of Trustees of Michigan State University, East Lansing, MI (US); Fraunhofer USA, East Lansing, MI (US)

(72) Inventors: Qi Hua Fan, Okemos, MI (US); Thomas Schuelke, Pinckney, MI (US); Lars Haubold, East Lansing, MI (US); Michael Petzold, Flint, MI (US)

(73) Assignees: Board of Trustees of Michigan State University, East Lansing, MI (US); Fraunhofer USA, East Lansing, MI (US)

( * ) Notice: Subject to any disclaimer, the term of this patent is extended or adjusted under 35 U.S.C. 154(b) by 0 days.

(21) Appl. No.: 16/642,133

(22) PCT Filed: Jun. 19, 2019

(86) PCT No.: PCT/US2019/038034
§ 371 (c)(1),
(2) Date: Feb. 26, 2020

(87) PCT Pub. No.: WO2019/246296
PCT Pub. Date: Dec. 26, 2019

(65) Prior Publication Data
US 2020/0303168 A1 Sep. 24, 2020

Related U.S. Application Data

(60) Provisional application No. 62/687,357, filed on Jun. 20, 2018.

(51) Int. Cl.
*H01J 37/32* (2006.01)
*H01J 37/08* (2006.01)
(Continued)

(52) U.S. Cl.
CPC ........ *H01J 37/32422* (2013.01); *H01J 37/08* (2013.01); *H01J 37/32669* (2013.01); *H01J 37/3405* (2013.01); *C23C 16/26* (2013.01)

(58) Field of Classification Search
None
See application file for complete search history.

(56) References Cited

U.S. PATENT DOCUMENTS 3,321,919 A * 5/1967 Marolda ................. H05H 1/52
376/319
3,952,228 A 4/1976 Reader et al.
(Continued)

FOREIGN PATENT DOCUMENTS

WO WO-2011/097183 A2 8/2011
WO WO-2018/175689 A1 9/2018

OTHER PUBLICATIONS

Derwent 2004-426864 to Cho published Jan. 2004.*
(Continued)

*Primary Examiner* — John J Brayton
(74) *Attorney, Agent, or Firm* — Harness, Dickey & Pierce, PLC

(57) ABSTRACT

A single beam plasma or ion source apparatus is provided. Another aspect employs an ion source including multiple magnets and magnetic shunts arranged in a generally E cross-sectional shape. A further aspect of an ion source includes magnets and/or magnetic shunts which create a magnetic flux with a central dip or outward undulation located in an open space within a plasma source. In another aspect, an ion source includes a removeable cap attached to an anode body which surrounds the magnets. Yet a further aspect provides a single beam plasma source which generates ions simultaneously with target sputtering and at the same internal pressure.

33 Claims, 11 Drawing Sheets

(51) Int. Cl.
  *H01J 37/34* (2006.01)
  *C23C 16/26* (2006.01)

(56) References Cited

U.S. PATENT DOCUMENTS

| | | | |
|---|---|---|---|
| 3,956,666 | A | 5/1976 | Reader et al. |
| 3,969,646 | A | 7/1976 | Reader et al. |
| 4,481,062 | A | 11/1984 | Kaufman et al. |
| 4,873,467 | A | 10/1989 | Kaufman et al. |
| 4,892,633 | A | 1/1990 | Welty |
| 4,954,751 | A | 9/1990 | Kaufman et al. |
| 5,032,202 | A | 7/1991 | Tsai et al. |
| 5,246,532 | A | 9/1993 | Ishida |
| 5,304,279 | A | 4/1994 | Coultas et al. |
| 5,415,754 | A | 5/1995 | Manley |
| 6,454,910 | B1 | 9/2002 | Zhurin et al. |
| 6,456,011 | B1 | 9/2002 | Bugrova et al. |
| 6,608,431 | B1 | 8/2003 | Kaufman |
| 6,682,634 | B1 | 1/2004 | Kahn et al. |
| 6,740,212 | B2 | 5/2004 | Fan et al. |
| 6,750,600 | B2 | 6/2004 | Kaufman et al. |
| 6,843,891 | B2 | 1/2005 | Kahn et al. |
| 6,864,485 | B2 | 3/2005 | Kahn et al. |
| 6,870,164 | B1 | 3/2005 | Baldwin et al. |
| 8,994,258 | B1 | 3/2015 | Kaufman et al. |
| 9,496,376 | B2 | 11/2016 | Yamazaki et al. |
| 10,134,557 | B2 * | 11/2018 | Madocks ............ H01J 27/024 |
| 2008/0169189 | A1 | 7/2008 | Wei et al. |
| 2009/0270283 | A1 * | 10/2009 | Cooper ............ C23C 14/0605 508/103 |
| 2011/0277823 | A1 | 11/2011 | Fan et al. |
| 2013/0244293 | A1 | 9/2013 | Balan et al. |
| 2013/0307414 | A1 | 11/2013 | Choi |
| 2014/0238861 | A1 | 8/2014 | Foret |
| 2014/0313574 | A1 | 10/2014 | Bills et al. |
| 2015/0041454 | A1 | 2/2015 | Foret |
| 2015/0307360 | A1 | 10/2015 | Bills et al. |
| 2016/0027608 | A1 | 1/2016 | Madocks |
| 2016/0215111 | A1 | 7/2016 | Bilek et al. |
| 2016/0276134 | A1 | 9/2016 | Collins et al. |
| 2016/0322174 | A1 | 11/2016 | Fan et al. |
| 2016/0351404 | A1 | 12/2016 | Aramaki et al. |
| 2017/0029936 | A1 | 2/2017 | Chistyakov |
| 2018/0073133 | A1 | 3/2018 | Bertran Serra et al. |
| 2018/0087151 | A1 | 3/2018 | Manabe et al. |

OTHER PUBLICATIONS

International Search Report dated Oct. 25, 2019 in corresponding PCT Application No. PCT/US2019/038034.
Wikipedia, "Sputtering" article, last edited and published Apr. 20, 2018.
Kurt J. Lesker Company, www.lesker.com/newweb/chambers/std_sphericalchamber.cfm Internet page published at least as early as May 14, 2018.
Kurt J. Lesker Company, "Torus® Circular UHV (Ultra High Vacuum) Magnetron Sputtering Sources" published at least as early as May 14, 2018.
Kurt J. Lesker Company, "Torus® 10 CA Performance Magnetron Production Cathodes" published at least as early as May 14, 2018.
Kurt J. Lesker Company, "Torus® Linear Magnetrons", www.lesker.com, published at least as early as May 14, 2018.
Kurt J. Lesker Company, "R&D Magnetron Sputtering Sources Overview" published at least as early as May 14, 2018.
Kurt J. Lesker Company, "Torus® MagKeeper™ Magnetron Sputtering Sources", www.lesker.com, published at least as early as May 14, 2018.
Matt Hughes, Semicore Equipment, Inc., Article "What is DC Sputtering?" published Nov. 26, 2016.
Matt Hughes, Semicore Equipment, Inc., "What is RF Sputtering?" published Oct. 27, 2016.
Wikipedia, "Sputter deposition," article last edited and published Dec. 14, 2017.
Hopwood, J et al., "Langmuir probe measurements of a radio frequency induction plasma", Journal of Vacuum Science & Technology A: Vacuum, Surfaces, and Films. 1993.
Dehkhoda, AM et al., "A novel method to tailor the porous structure of KOH-activated biochar and its application in capacitive deionization and energy storage", Biomass and Bioenergy, 2016.
Talukder, A-A, "Plasma treatment of zinc oxide thin film and temperature sensing using the zinc oxide thin film", <https://openprairie.sdstate.edu/cgi/viewcontent.cgi>?article=2048&context= etd 2016.
Foggiato, J., "Handbook of Thin-Film Deposition Processes and Techniques, Second Edition—Chapter 3: Chemical Vapor Deposition of Silicon Dioxide Films," Noyes Publications, 2002, 54 pages.
Gabriel, O. et al., "Plasma monitoring and PECVD process control in thin film silicon-based solar cell manufacturing," EPJ Photovoltaics 5, Feb. 5, 2014, 9 pages.
Henkel, C. et al., "Deposition of dielectrics and metal gate stacks (CVC, ALD), Lecture 8," KTH, published Spring 2013, 57 pages.
Menendez, A. et al., "Depositions of Thin Films: PECVD Process," Silicon Based Thin Film Solar-Cells, 2013, pp. 29-57.
Talukder, A. et al., "Improving electrical properties of sol-gel derived zinc oxide thin films by plasma treatment," Journal of Applied Physics 120, 155303, 2016, 24 pages.
Wang, K. et al., "Low-temperature plasma exfoliated n-doped graphene for symmetrical electrode supercapacitors," Nano Energy Journal vol. 31, Journal Issue C, Journal ID: ISSN 2211-2855, Jan. 1, 2017, 27 pages.
Summary of prior capacitively coupled and inductively coupled plasma sources—publicly used prior to Jan. of 2017.
South Dakota State University, "Reducing cost of producing supercapacitors," www.sciencedaily.com, Aug. 18, 2016, 2 page.
"SDSU Researchers Use Biochar to Develop Cost-Effective Supercapacitors," www.azom.com, Aug. 22, 2016, 3 pages.
South Dakota State University, "Transforming biochar into activated carbon," www.sciencedaily.com, Jan. 30, 2015, 2 pages.
Simpson, J., "Plasma Etching of Biochar Reduces Supercapacitor Costs," Engineering 360, Sep. 7, 2016, 1 page.
Zeng, A. et al., "Plasma Treated Active Carbon for Capacitive Deionization of Saline Water," Department of Electrical and Computer Engineering, et al., published prior to Jul. 18, 2019, 16 pages.
Neodymium Ring Magnet—RZ0Y0X0, www.kjmagnetics.com, offered for sale prior to Jul. 18, 2019, 6 pages.
Summary of prior capacitively coupled and magnetically enhanced RF plasma discharge systems—publicly used or disclosed prior to Jul. of 2018.
"Plasma-enhanced chemical vapor deposition," www.wikipedia.com, Jul. 17, 2018, 3 pages.

* cited by examiner

SINGLE BEAM PLASMA SOURCE

CROSS-REFERENCE TO RELATED APPLICATIONS

This application is a National Phase entry of PCT International Application No. PCT/US2019/038034, filed on Jun. 19, 2019, which claims priority to U.S. Provisional Patent Application Ser. No. 62/687,357 filed on Jun. 20, 2018. The entire disclosure of the above applications are incorporated by reference herein.

GOVERNMENT RIGHTS

This invention was made with government support under 1700785, 1700787 and 1724941 awarded by the National Science Foundation. The government has certain rights in the invention.

BACKGROUND AND SUMMARY

The present application generally pertains to an ion source and more particularly to a single beam plasma or ion source apparatus.

Thin film processing is widely used for manufacturing semiconductor devices, displays, solar panels, tribological coatings, sensors and micro-electro-mechanical systems. Conventional physical and chemical vapor depositions generally result in loosely packed atoms 1 on a workpiece 2 due to their limited kinetic energies, as is shown in FIG. 1. The micro-porous structures lead to unstable material properties and device performance. Nevertheless, ion sources have become the essential tools for manufacturing high-quality thin films and devices.

One conventional ion source is of a racetrack design illustrated in FIGS. 2 and 3. This device consists of a racetrack- or ring-shaped anode 3, a pair of center and outer magnetic poles, and magnets 4. The anode is connected to the positive terminal of a DC power supply. The magnetic poles are connected to a ground potential and act as cathodes 5. Electrons attracted toward the anode experience a Lorenz force that drives the electrons in E×B direction (where E is an electrical field vector and B is a magnetic induction field vector). Hence, the electrons drift along the racetrack in an electron trajectory 6 instead of directly reaching the anode. The confined electrons ionize the process gases and create ions 7, which are subsequently extracted out of the plasma region.

There are two critical requirements for the racetrack ion sources to operate properly: 1) the electrons must drift in a closed loop (a racetrack or a circular ring) to ensure they are confined; and 2) the gap between the anode and cathode must be small (a few millimeters) to create a strong electrical field to extract the ions. Hence, a racetrack linear source actually produces two beams in the straight section and a circular source generates a ring-shaped beam. Therefore, the emitted ions have a wide distribution of emission angles; research has shown that the associated ion incident angle has a notable effect on the morphology of the treated surfaces. Furthermore, the racetrack ion sources require a voltage greater than 250 V to sustain the plasma discharges. This is determined by the electromagnetic fields inbetween the anode and cathode. Therefore, the ion energies could be so high that they can damage the deposited films and undesirably roughen the film surfaces.

The narrow emission slit in the traditional racetrack ion sources results in frequent maintenance due to undesired material deposition and contamination of the anode and cathode adjacent the exit slit. Furthermore, it is troublesome to realign the cathode after cleaning to maintain a uniform emission slit since the traditional racetrack construction mounts the magnetic steel cathode directly onto the magnets. Exemplary racetrack configurations are disclosed in U.S. Patent Publication No. 2016/0027608 entitled "Closed Drift Magnetic Field Ion Source Apparatus Containing Self-Cleaning Anode and a Process for Substrate Modification Therewith" which published to Madocks on Jan. 28, 2016, and U.S. Patent Publication No. 2017/0029936 entitled "High Power Pulse Ionized Physical Vapor Deposition" which published to Chistyakov on Feb. 2, 2017, both of which are incorporated by reference herein.

Another traditional ion source is disclosed in U.S. Pat. No. 4,481,062 entitled "Electron Bombardment Ion Sources" which issued to Kaufman et al. on Nov. 6, 1984, and is incorporated by reference herein. This approach commonly works at low pressure (for example, $10^{-4}$ Torr) which is incompatible with a typical sputtering pressure of at least $10^{-3}$ Torr. Furthermore, the Kaufman ion source undesirably uses a filament to thermionically emit electrons which makes it unsuitable for use with reactive gases. Moreover, the design typically employs metal grids across an outlet, thereby disadvantageously being prone to contamination, and requiring frequent downtime and maintenance.

In accordance with the present invention, a single beam plasma or ion source apparatus is provided. A further aspect of an ion source includes magnets and/or magnetic shunts which create a magnetic flux with a central dip or outward undulation located in an open space where a plasma is created. Another aspect employs an ion source including multiple magnets and at least three magnetic shunts arranged in a generally E cross-sectional shape. In another aspect, an ion source includes a removable non-magnetic cathode, cap or cover attached to an anode body which surrounds the magnets such that the cap can be easily removed without interaction with or direct attachment to the magnetic field for easy cleaning. Yet a further aspect provides a single beam plasma source which generates ions simultaneously with other deposition sources (such as sputtering magnetrons and plasma enhanced chemical vapor deposition equipment) at the same process pressure. Another aspect uses a single beam ion source for direct thin film deposition by either pointing the ion beam to and sputtering a target, or introducing a precursor gas that is subsequently dissociated by the ion source plasma. An additional aspect introduces a radio frequency electromagnetic field between the ion source and a specimen to enhance the beam plasma. Moreover, an ion source is centrally located within a surrounding sputter target in a further aspect of the present apparatus.

The present plasma source apparatus is advantageous over traditional devices. For example, the present apparatus advantageously emits a single ion beam, the cross-sectional diameter or width of which can be modulated from about 3 mm to at least 30 mm, and it can be made to any length in a single beam linear configuration. Moreover, the beam of the present apparatus can be generated in a wide range of operating pressures (for example 1 mTorr to >500 mTorr) which is compatible with simultaneous sputtering. The present apparatus beneficially operates with many different gases including inert and reactive gases since it does not use a filament. Furthermore, the present ion source can operate over a wide range of discharge voltages from 30 to greater than 500 V that lead to tunable ion energies for optimal ion-surface interactions.

The present apparatus is also advantageous for long-term stable operation since: 1) the anode is unlikely to be contaminated because no direct coating flux can reach the active surfaces; 2) the cathode is not sensitive to the coatings because it can be set at a floating potential and gets automatically biased; and 3) the non-magnetic cap or cover can be easily disassembled and reassembled for maintenance, as compared to conventional devices. It is noteworthy that the present apparatus emits a stable ion beam without interference with other plasma sources that simultaneously operate. Another advantage is the single beam ion source leads to significant decrease in the discharge voltage of a sputtering source and subsequently improves a sputtered film quality. Additional features and benefits will become apparent from the following description and appended claims taken in conjunction with the accompanying drawings.

DETAILED DESCRIPTION

Figure 1:
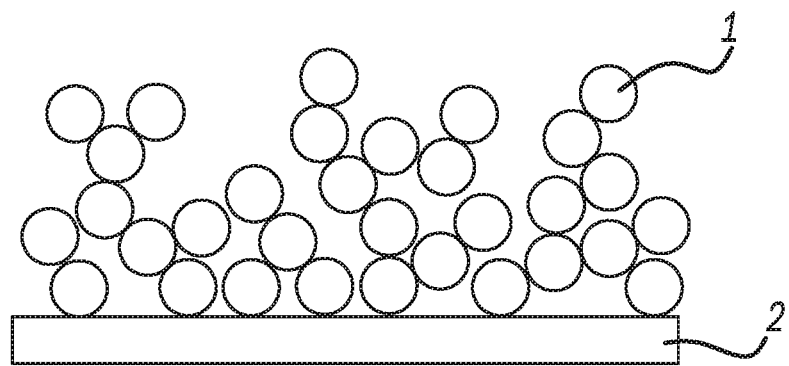
FIG. 1 is a diagrammatic cross-sectional view showing prior art coating atoms on a workpiece without the assistance of an ion source.
Figure 2:
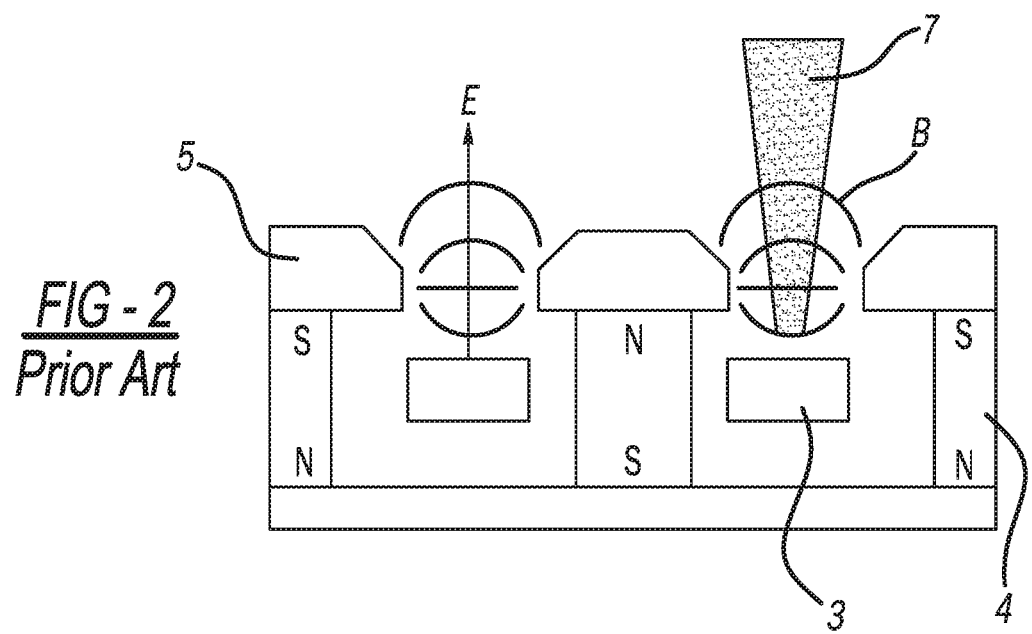
FIG. 2 is a diagrammatic cross-sectional view showing a prior art ion source.
Figure 3:
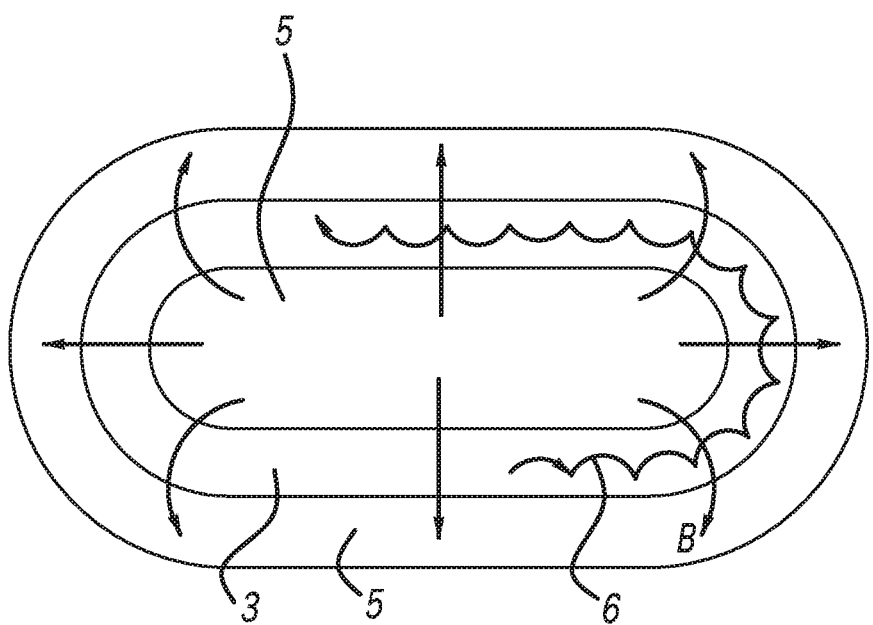
FIG. 3 is a diagrammatic top view showing the prior art ion source of FIG. 2.
Figure 4:
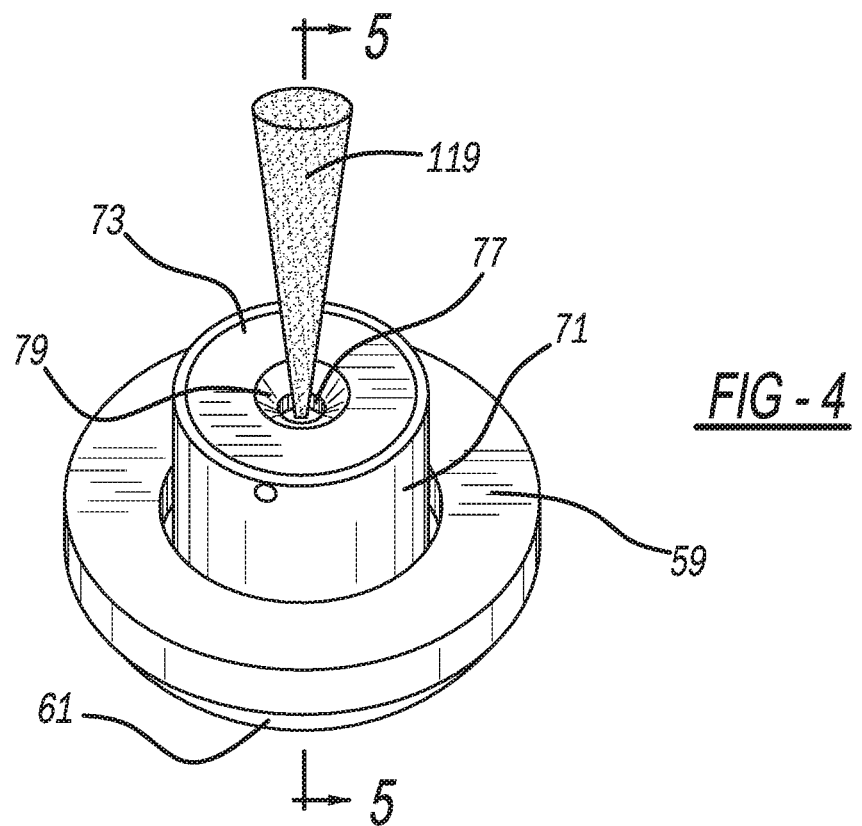
FIG. 4 is a perspective view showing the present ion source.

A preferred embodiment of a single beam plasma or ion source apparatus 21 can be observed in FIGS. 4-7 and 10. Ion source apparatus 21 includes a vacuum chamber 23, an ion source 25, a deposition source 27, and a specimen or workpiece 29. Ion source 25 and deposition source 27 are mounted to vacuum chamber 23 through vacuum-sealed ports. The apparatus also includes a pumping port connected to a vacuum pump 31, an input gas port connected to a process gas source, pressure gauges and optional heaters. Various configurations of the vacuum chamber exist, depending upon the specific functions desired of the system.

Exemplary ion source 25 includes an anode 51 and a cathode 53. The anode is mounted upon an insulator 55. The cathode is mounted on a metallic closure plate 61, which in turn is mounted to flange 59 on vacuum chamber 23. In this case, cathode 53 is set at an electrical ground potential. Cathode 53 can be a single piece or two pieces that include an external structural body 71 and an end cap 73 removeably fastened thereto via screws 75. Cap 73 of cathode 53 inwardly overhangs anode 51 with a single through-opening 77 in a center thereof defining an ion emission outlet. In the presently illustrated embodiment, structural body 71 and cap 73 of cathode 53 have circular peripheries and opening 77 is circular. Furthermore, the presently illustrated cap 73 employs a frustoconically tapered surface 79 adjacent through-opening 77.

Figure 12:
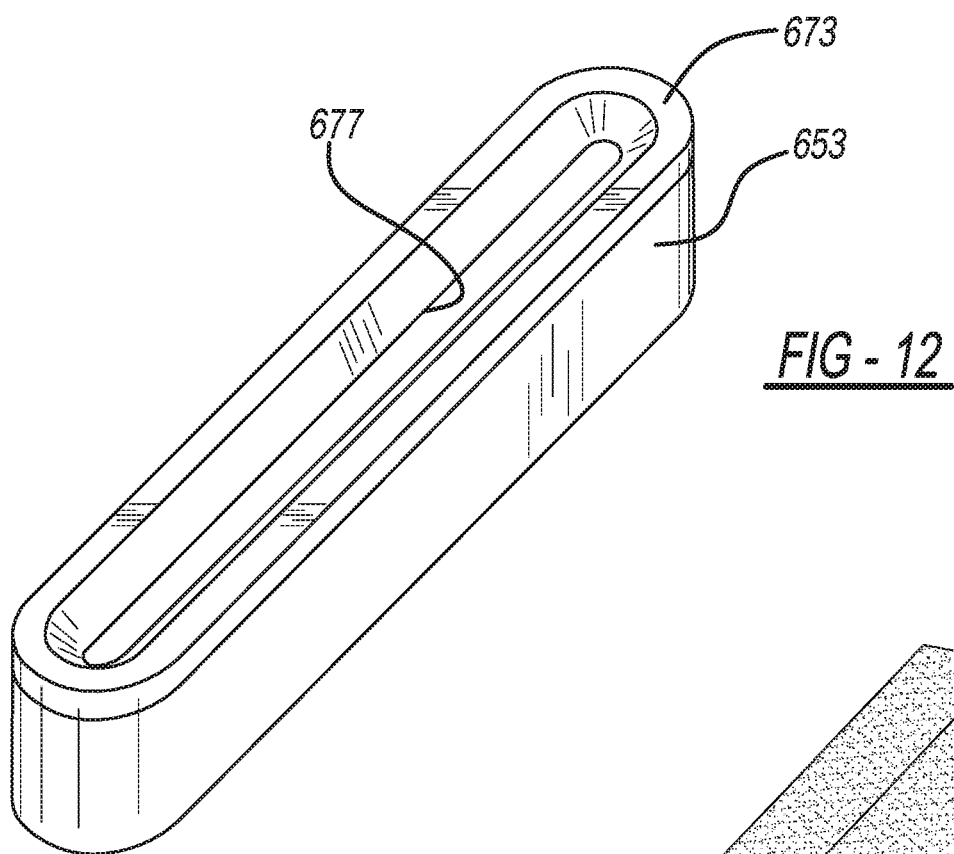
FIG. 12 is a perspective view showing an alternate embodiment of the present ion source.
Figure 13:
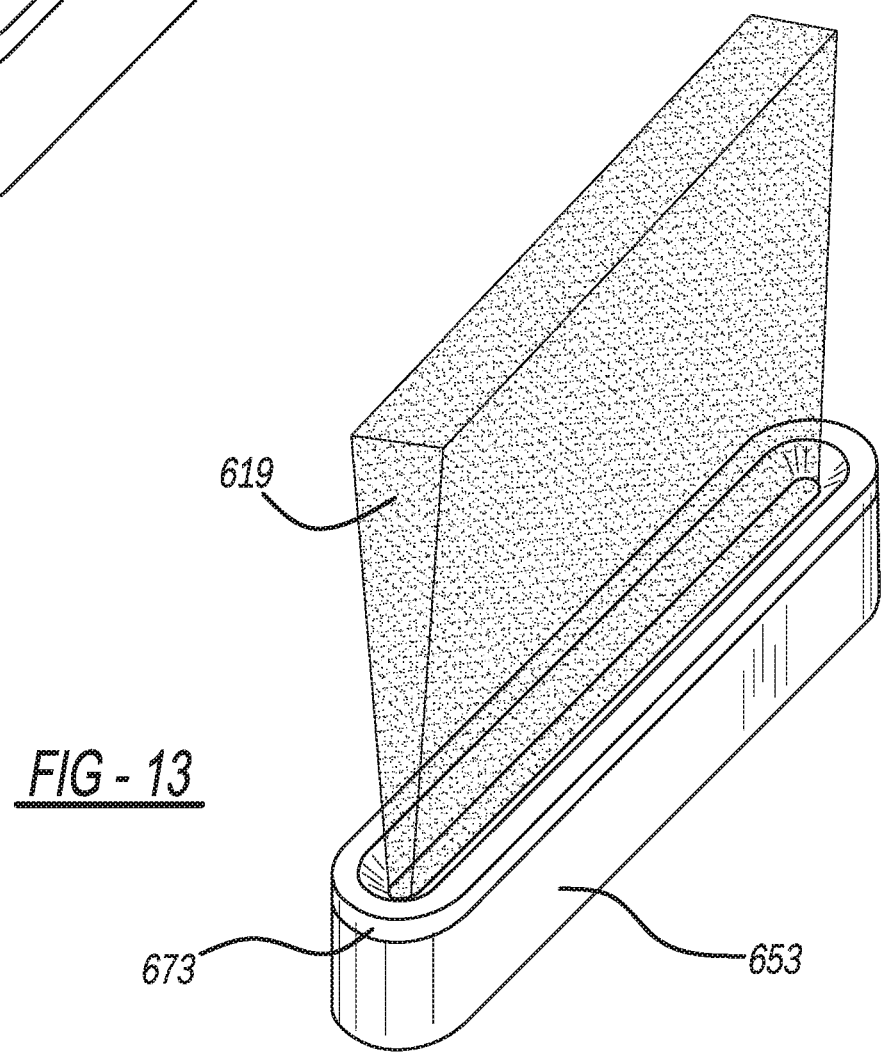
FIG. 13 is a perspective view showing the alternate embodiment ion source of FIG. 12.

It is alternately envisioned that other arcuate shapes such as ovals or other single apertured, elongated hole shapes may be employed for these noted components. An alternate embodiment can be observed in FIGS. 12 and 13 where a tapered single through-opening 677 in a cap 673 of a cathode 653 is linearly elongated in a lateral direction generally perpendicular to an emission central plane or direction of ions 619. The internal anode components are also laterally elongated surrounding a plasma area below opening 677.

Returning to the exemplary embodiment illustrated in FIGS. 5-10, multiple permanent magnets 91, preferably two, and multiple magnetic shunts 93, preferably three, are enclosed in anode 51. An electrically conductive internal cover 94 defines an open plasma region or area 96 essentially aligned with opening 77. Magnets 91 and shunts 93 each have coaxially aligned, circular internal edges and circular external edges wherein they are each ring-shaped with a hollow center. Magnets 91 are sandwiched or stacked between the shunts 93 such that the magnets are spaced apart from each other by the middle shunt. The upper and lower magnets are placed in series, e.g. N-S/N-S or S-N/S-N. Moreover, the cross-section of each side of the magnet and shunt assembly has a generally E-shape with the elongated and internal edges of shunts 93 extending toward a centerline axis 95 of ion source 25. Magnets 91 and shunts 93 are internally secured within an anode body 97 which is coupled to an anode base 99 via screws or other threaded fasteners. An optional incoming gas or cooling fluid inlet 101 and associated passageways are disposed through anode base 99, insulator 55 and plate 61. It is noteworthy that all of anode 51, including magnets 91 and shunts 93, are spaced internally away from all of cathode 53 either by a gap or insulator.

Figure 5:
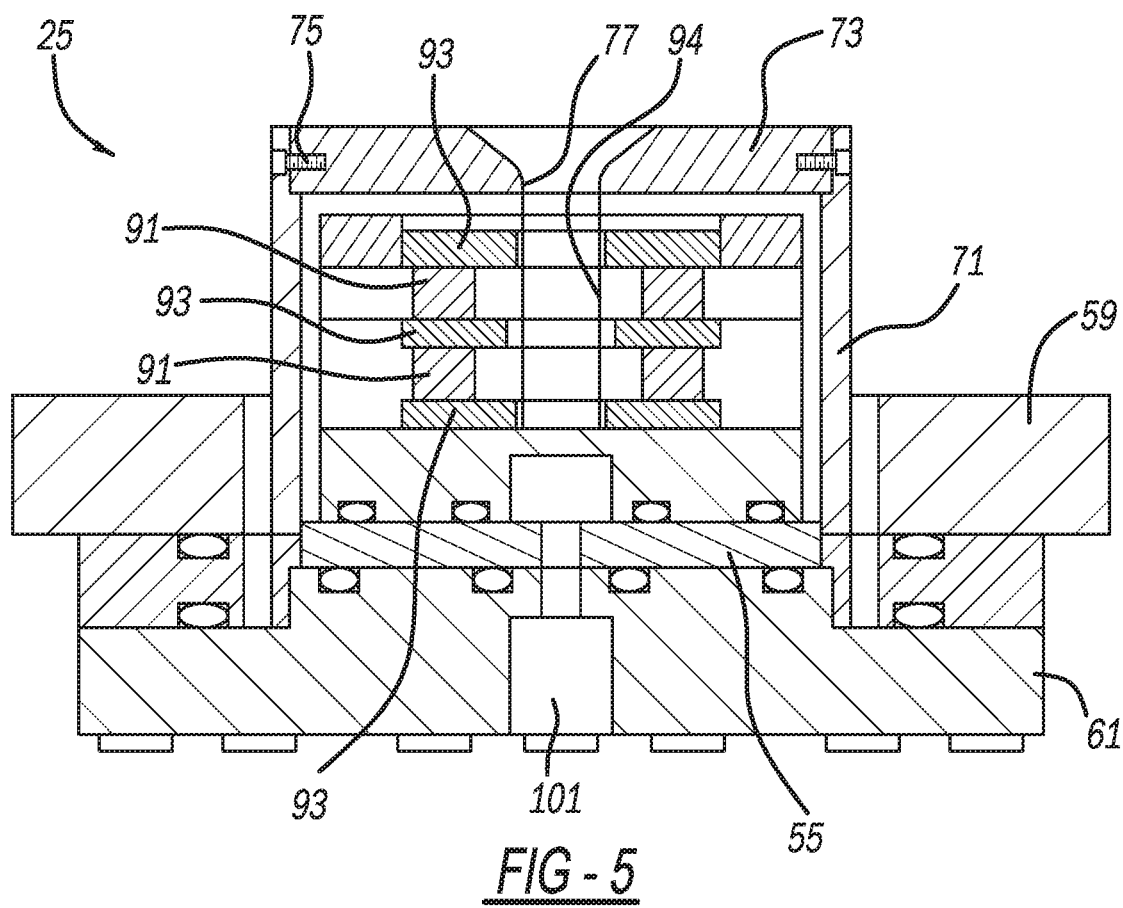
FIG. 5 is a cross-sectional view, taken along line 5-5 of FIG. 4, showing the present ion source, where the cathode is isolated from ground.
Figure 6:
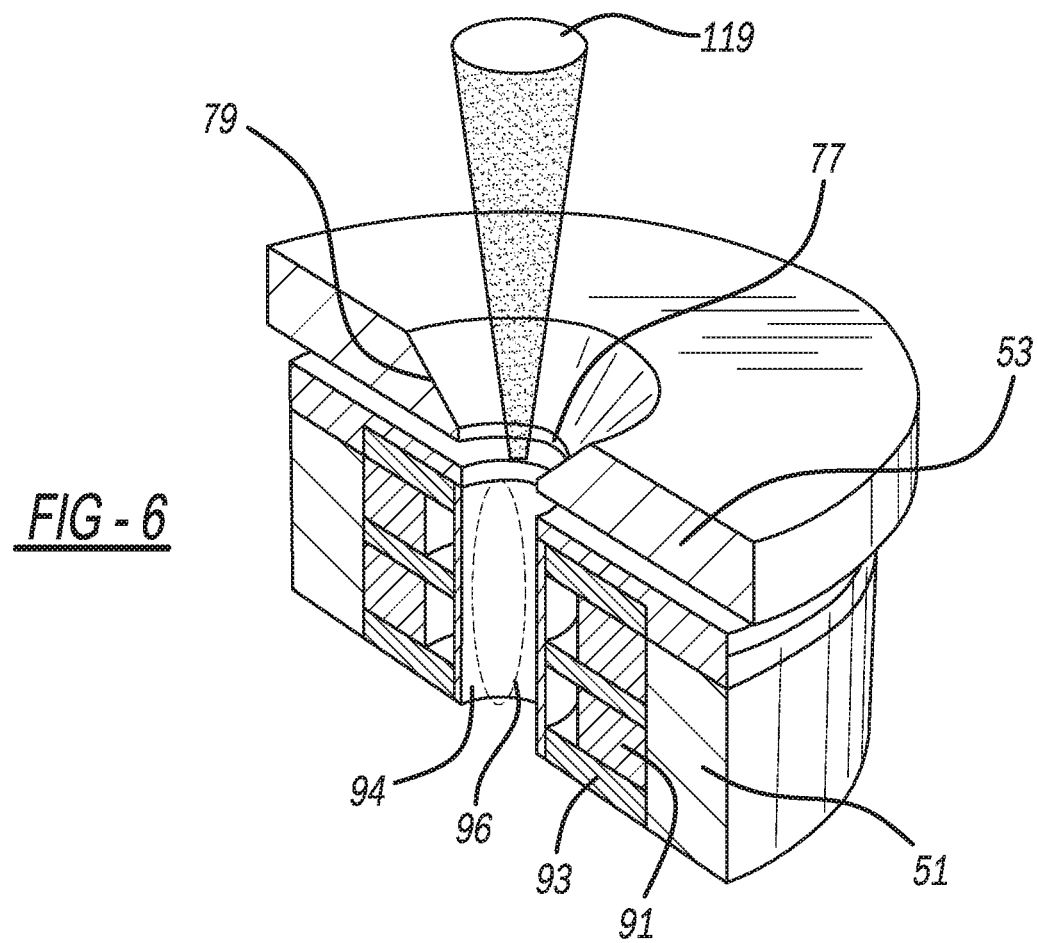
FIG. 6 is a partially fragmented perspective view showing the present ion source.
Figure 8:
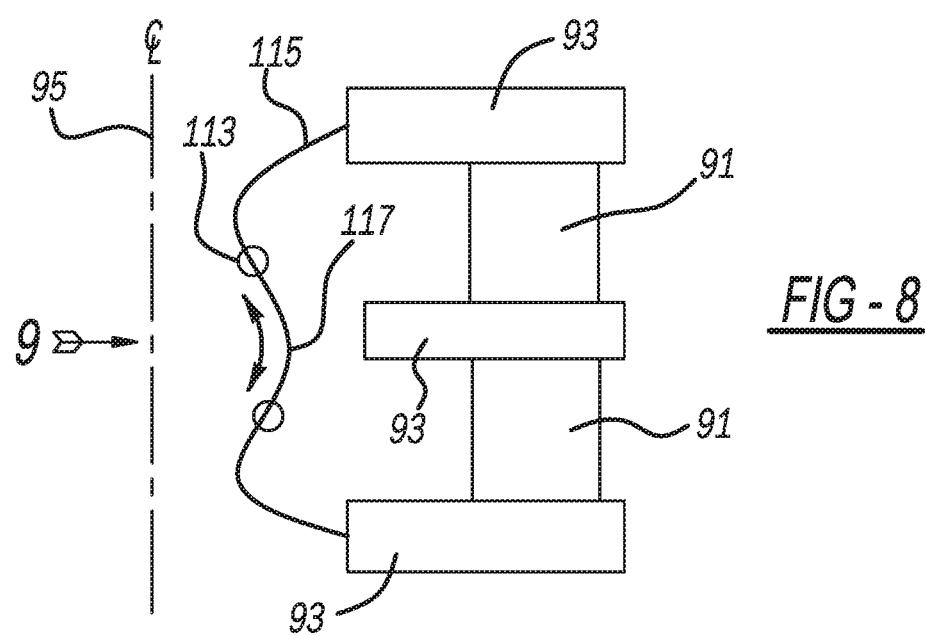
FIG. 8 is a diagrammatic cross-sectional view showing an exemplary magnet assembly used in the present ion source.
Figure 7:
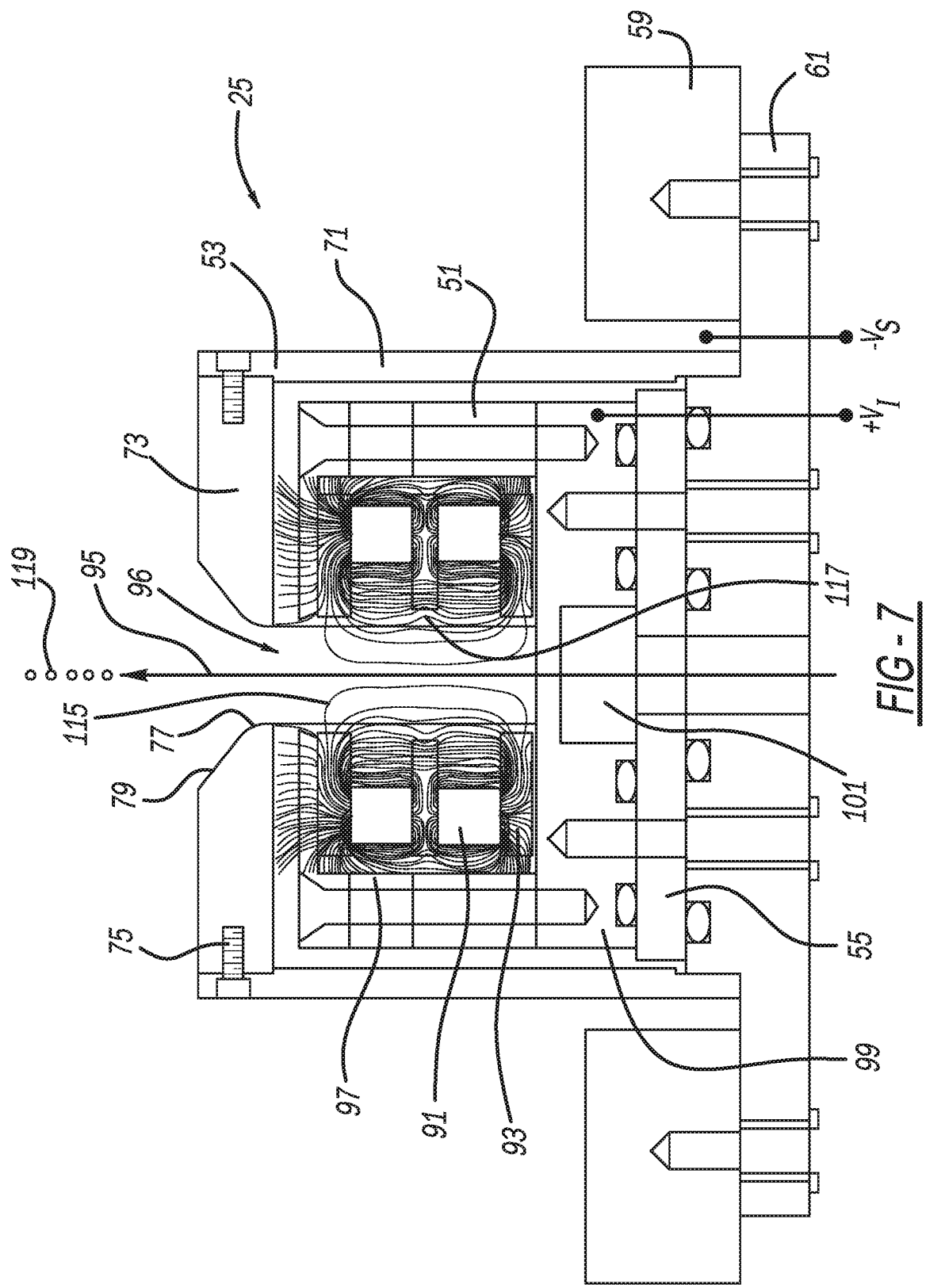
FIG. 7 is a cross-sectional view, like that of FIG. 5, showing magnetic flux lines and ion emissions from the present ion source, where the cathode is connected to ground potential.
Figure 9:
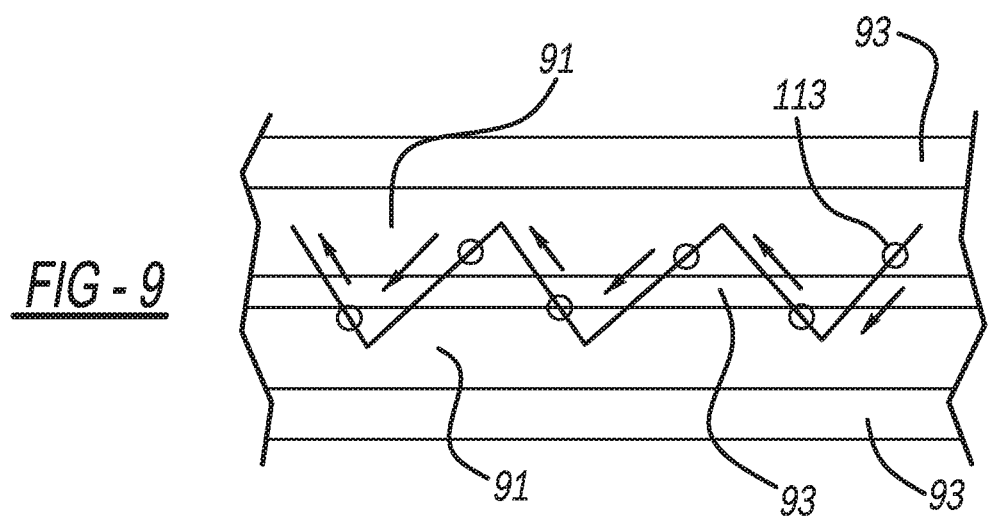
FIG. 9 is a diagrammatic view, taken in the direction of arrow 9 from FIG. 8, showing the present ion source.

In the FIG. 5 configuration, the cathode is isolated from ground at an electrically floating or biased potential. In the FIG. 7 version, however, the cathode is connected to ground potential through flange 59.

FIGS. 7-10 illustrate ion source apparatus 21 in operation. When energized, a precursor gas in an open plasma area 96 internal to anode 51 is converted into a plasma due to the energetic electrons 113 moving between the portions of the magnet and shunt assembly as acted upon by the associated electromagnetic fields. Magnetic flux lines 115 flow from one top shunt 93 to the bottom outer shunt 93 or vice versa. Furthermore, a dip 117 or outwardly depressed undulation of at least some of the magnet flux lines 115 are caused by the magnetic assembly. This dip 117 advantageously serves to delay and/or trap adjacent electrons 113 as they are otherwise flowing along magnetic flux lines 115 and reach the anode. This dip therefore advantageously increases ionization and promotes flux density of ions 119 emitted through outlet opening 77 of cathode cap 73 coaxially aligned with a longitudinal centerline axis 95. In certain configurations, the center shunt 93 is optional. Alternately, it is envisioned that multiple dips 117 may be provided between originating and terminating ends of the magnetic fields 115 within open plasma area 96.

The presently preferred construction of ion source 25 allows for adjustability of ion beam 119 from 3 mm to at least 30 mm in diameter or lateral width. This can be achieved through different sizing of outlet 77, magnets 91, and shunts 93. Furthermore, a single ion beam 119 is emitted from ion source 25 with the ions almost uniformly distributed around a center axis when viewed in cross-section, as contrasted to the traditional ring-like and hollow center ion beams generated from the racetrack ion sources. Moreover, while the presently preferred magnets 91 and shunts 93 are hollow annular rings coaxially aligned with centerline 95 in a circular single beam ion source, they may alternately consist of multiple solid rod or bar-like magnets that are arranged about centerline 119 in a circular or arcuate pattern, although some of the preferred advantages may not be realized. In a linear single beam ion source, the ends include half of the circular configuration described above and the straight section may consist of multiple solid rod or bar-like magnets. It is also alternately envisioned that more than two stacked magnets or electromagnets may be employed and if so, additional associated shunts may be provided so as to extend the generally E-cross-sectional configuration with more than three inwardly extending teeth or projecting edges.

Figure 10:
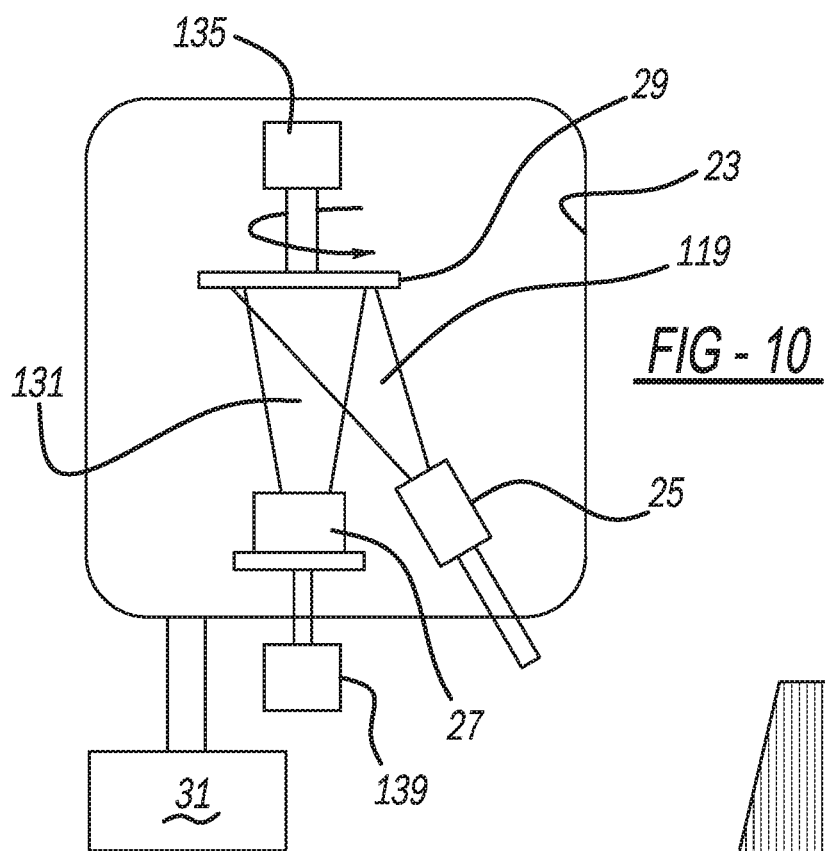
FIG. 10 is a diagrammatic view showing the present plasma or ion source apparatus in simultaneous operation with a deposition source inside a vacuum chamber.
Figure 11:
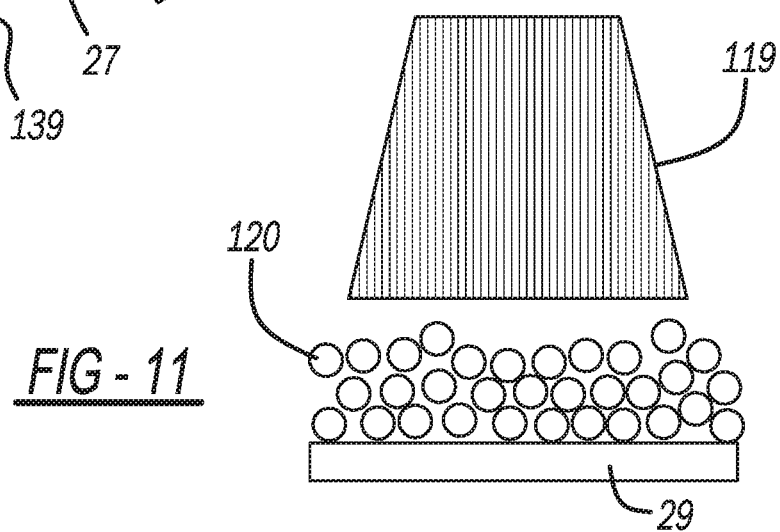
FIG. 11 is a diagrammatic cross-sectional view showing an interaction of coating atoms on a workpiece using the present ion source.

In one embodiment shown in FIG. 10, ion beam 119 is transmitted from ion source 25 to specimen 29, where target material 131 is subsequently deposited onto the surface of specimen 29 from source 27. In one structural configuration, specimen 29 is coupled to an electromagnetic actuator 135, such as an electrical motor or solenoid. A similar electromagnetic actuator 139 is coupled to source 27. These optional electromagnetic actuators 135 and 139 can impart rotational and/or linear movement to specimen 29 and source 27. The present ion source assisted deposition effectively overcomes the conventional loose atom packing problem and advantageously produces dense films with superior stability, smooth film surface, high electric conductivity, and strong coating adhesion, due to dense packing of atoms 120, as illustrated in FIG. 11.

Figure 14:
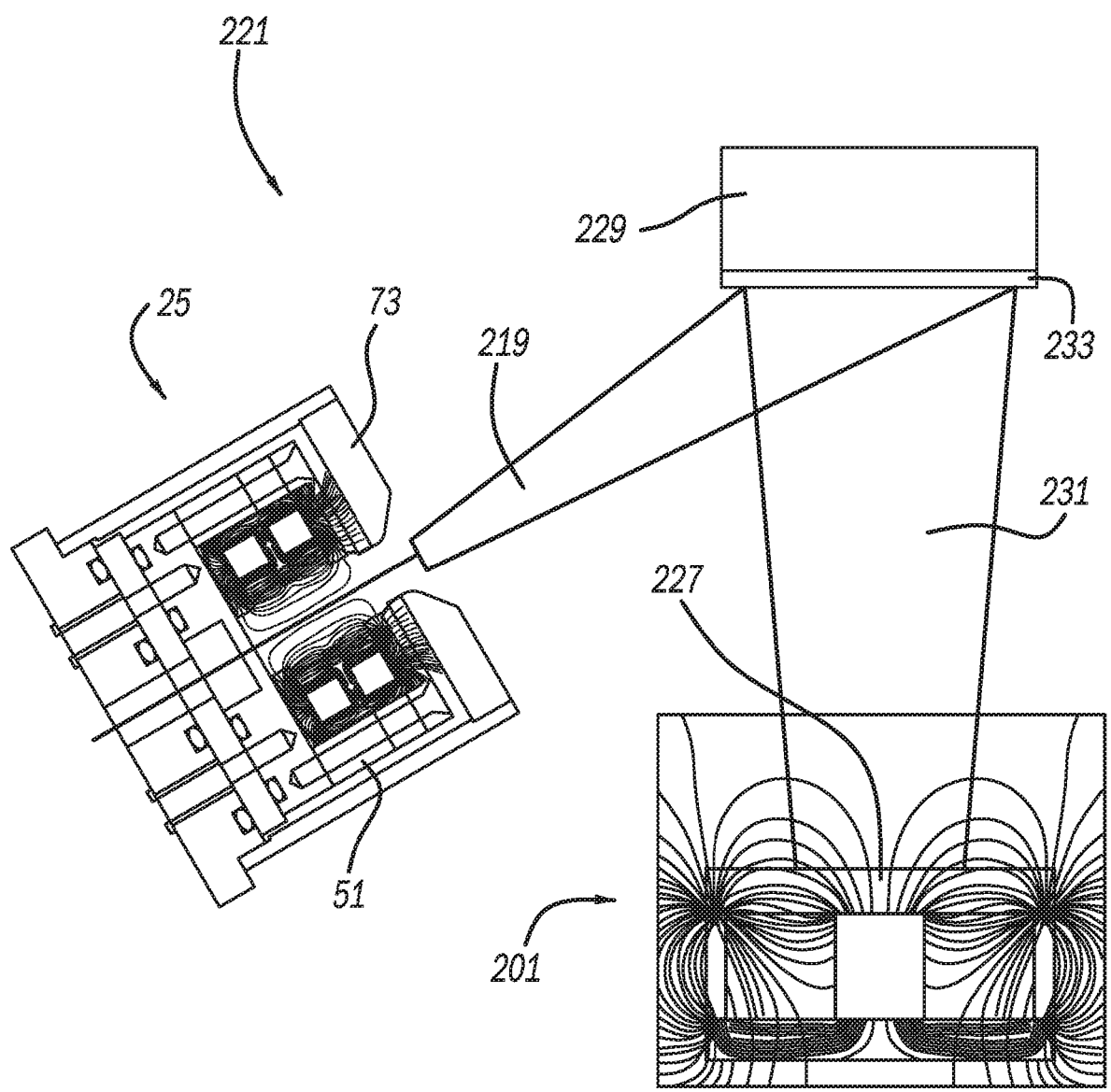
FIG. 14 is a diagrammatic view showing an alternate embodiment of the present plasma or ion source apparatus that is used to treat a thin film deposited from a magnetron source.

FIG. 14 illustrates an alternate embodiment of the present single beam plasma or ion source apparatus 221. In the present exemplary configuration, ion source 25 including its anode 51 and cathode 73, are essentially the same as in the prior embodiments of FIGS. 5-7. However, a sputtering source 201 is employed to operate simultaneously with the ion source 25. Sputtering source 201 is a magnetron sputter gun or other type of sputtering device, which generally includes a target 227 and an assembly of magnets and shunts that create a proper magnetic field in front of the target surface. In this embodiment, the single ion beam 219, is directly emitted toward specimen or workpiece 229 while target material 231 is simultaneously sputtered from target 227 and deposited on specimen 229 to form coating 233. This ion treatment occurs simultaneously with the sputtering deposition at the same vacuum chamber pressure.

In a production setting, the apparatus components can be set vertical or horizontal. Furthermore, the specimen can be rigid or flexible. It is also noteworthy that a conveyor or roller system may be employed with any of the embodiments disclosed in the present application.

Ion beam 219 interacts with deposited thin film 233, which is expected to directly improve characteristics of the film such as density, electric conductivity and barrier properties. This ion beam assisted thin-film growth is ideally suited for achieving super-smooth thin films and also to fabricate polycrystalline thin films at low temperatures such as room temperature.

The present ion source apparatus advantageously allows a wide range of operating pressures, such as those from 1 mTorr to 500 mTorr, which allow the ion creation and emission to be entirely compatible with sputtering. Furthermore, the present ion source apparatus advantageously allows ion creation and emission independent of the operating gas since no filament is used; thus, argon, oxygen and other inert and reactive gases may be used. The present ion source also works in a voltage control mode or a current control mode, and the discharge voltages can be as low as 30 volts. Moreover, the narrow focused ion beam advantageously provides a stable discharge without arcing.

Figure 15:
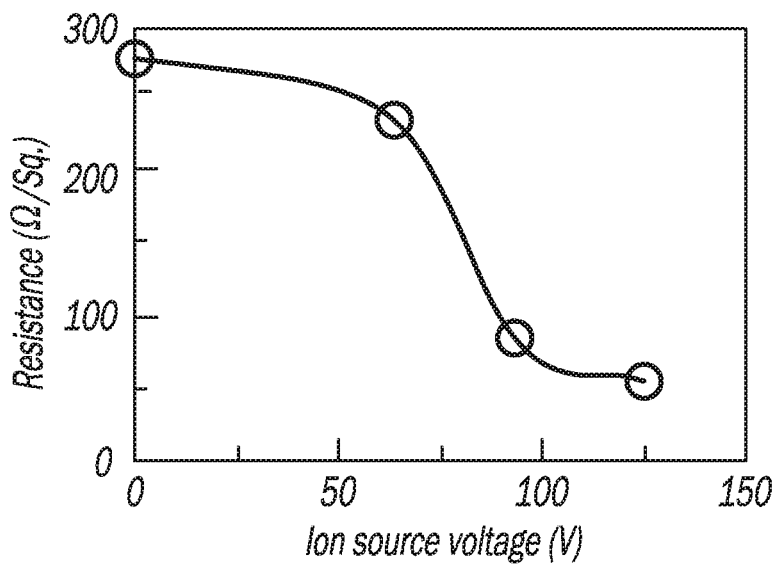
FIG. 15 is a graph of sheet resistance of indium-tin-oxide ("ITO") films produced by sputtering with the assistance of the present ion source at difference discharge voltages or ion energies.

In one example, the process gases consist of argon mixed with 0.6% oxygen and the pressure is maintained at 3.3 mTorr. The power applied to sputtering magnetron 201 is fixed at 30 Watts. Without ion source 25 power on, a five-minute sputtering creates an ITO coating 133 of approximately 36 nm thickness, i.e. 7.2 nm per minute. On the other hand, the same magnetron is powered at 30 W and the ion source is turned on with a voltage of approximately 96 V. A five-minute deposition produces an ITO film of 52 nm thickness, i.e. 10.0 nm per minute. Hence, the ion source leads to approximately 39% increase in the deposition rates. Based on the deposition rates and the same deposition parameters, ITO films of about 100 nm thickness were deposited on glass substrates at room temperature with and without the ion source powered on. The sheet resistance of the ITO films decreased to ⅕ as shown in FIG. 15.

The creation and emission of ion beam 119 from ion source 25 simultaneously with a sputtering of target material onto substrate 29 beneficially creates a smoother and denser external surface of coating 133 on substrate 29. This is achieved by ions 119 impacting against the target material atoms as the atoms are being deposited or attaching to the previously deposited target material, and thereby pushing the new atoms into voids in each prior layer in the coating growth and buildup (see FIG. 11). This is ideally suited for depositing a coating 133 and improving the quality thereof including increased deposition rates and better crystallinity.

Figure 16:
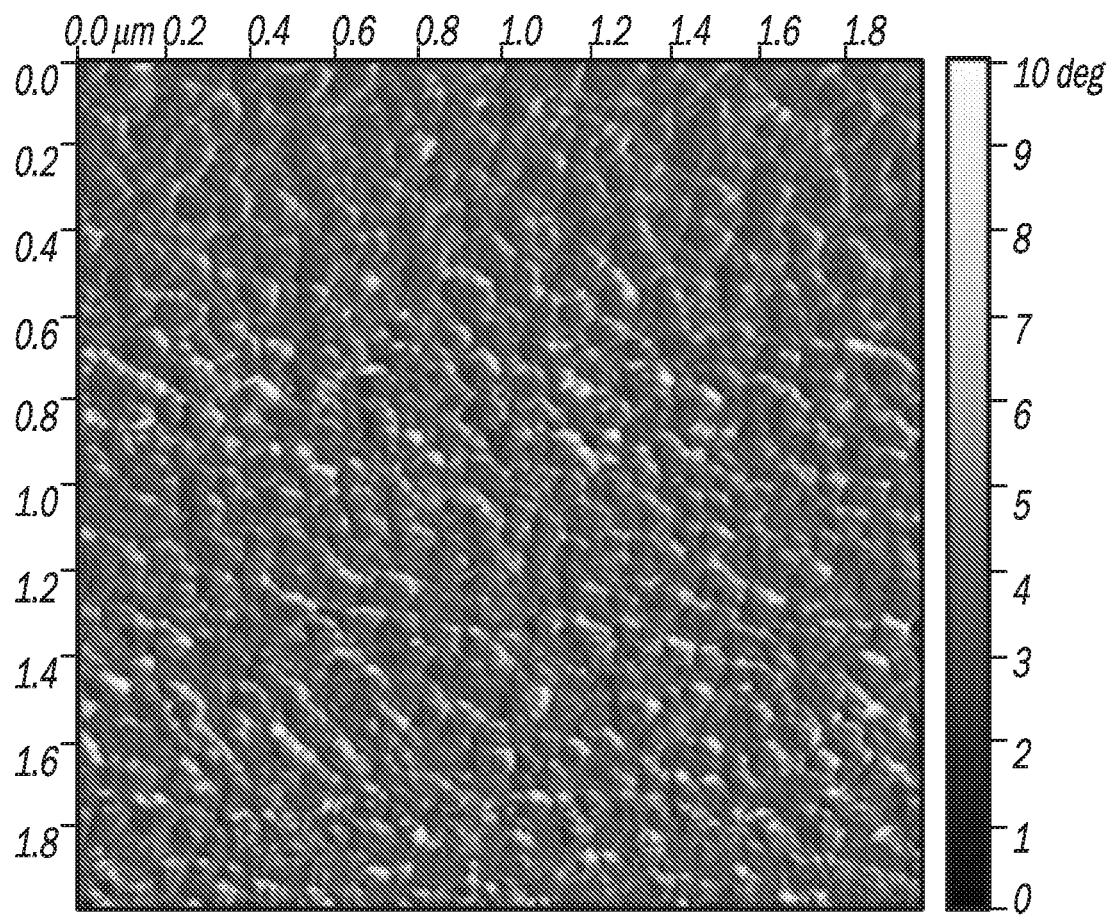
FIGS. 16 and 17 are atomic force microscopy phase images of ITO films deposited by sputtering without and with the assistance of the present ion source, respectively.
Figure 17:
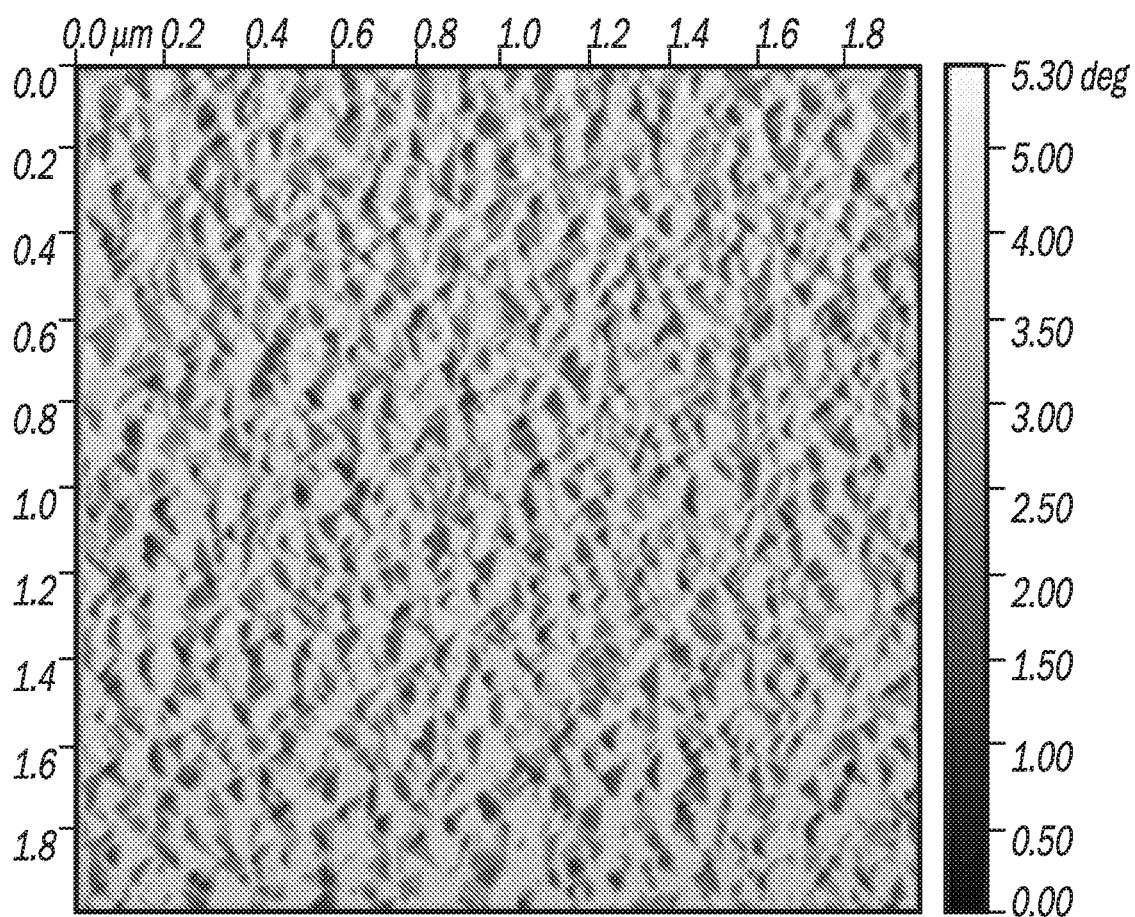

These improvements based on the present apparatus obtain greater light transmittance through coating 133 when the coating is an ITO films, and/or the coating exhibits improved hardness. FIGS. 16 and 17 show the atomic force microscopy phase images of indium-tin-oxide ("ITO") films deposited using apparatus 221 without and with ion source 25 in simultaneous operation, respectively. The results indicate that the ion source assisted deposition leads to dense and smooth ITO films.

Figure 18:
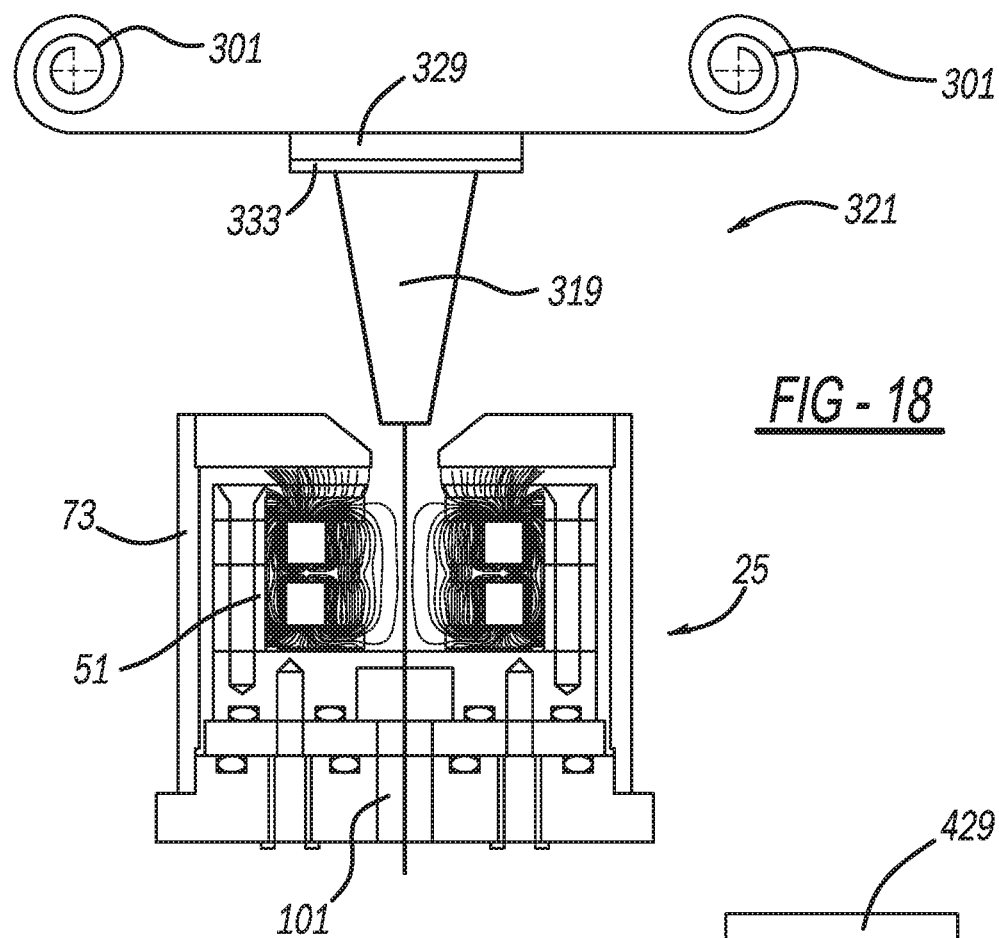
FIG. 18 is a diagrammatic view showing another alternate embodiment of the present plasma or ion source apparatus for direct deposition of thin films.

Reference should now be made to FIG. 18. Another embodiment of a single beam plasma or ion source apparatus 321 includes ion source 25 with anode 51 and cathode 73 essentially like that of the prior embodiments. This apparatus emits a chemical precursor gas from inlet 101 or another remote entrance into ion source 25 such that the plasma generated therein by the electromagnetic fields creates desired chemical species that subsequently deposit as a coating 333 on a specimen or workpiece 329. One such gas precursor is $CH_4$. This chemical vapor deposition process deposits and grows carbon coatings. Alternately, a carbon-based sputter target can be employed as with any of the other embodiments disclosed herein to produce carbon atoms as the specimen coating.

In the present exemplary configuration, specimen 329 on a conveyor system moves across the ion source and gets coated. A roll-to-roll coating arrangement 301 can also coat a flexible PET film, flexible and thin stainless steel sheet, or the like. Such a film and roller configuration can be employed with any of the embodiments disclosed herein.

Figure 19:
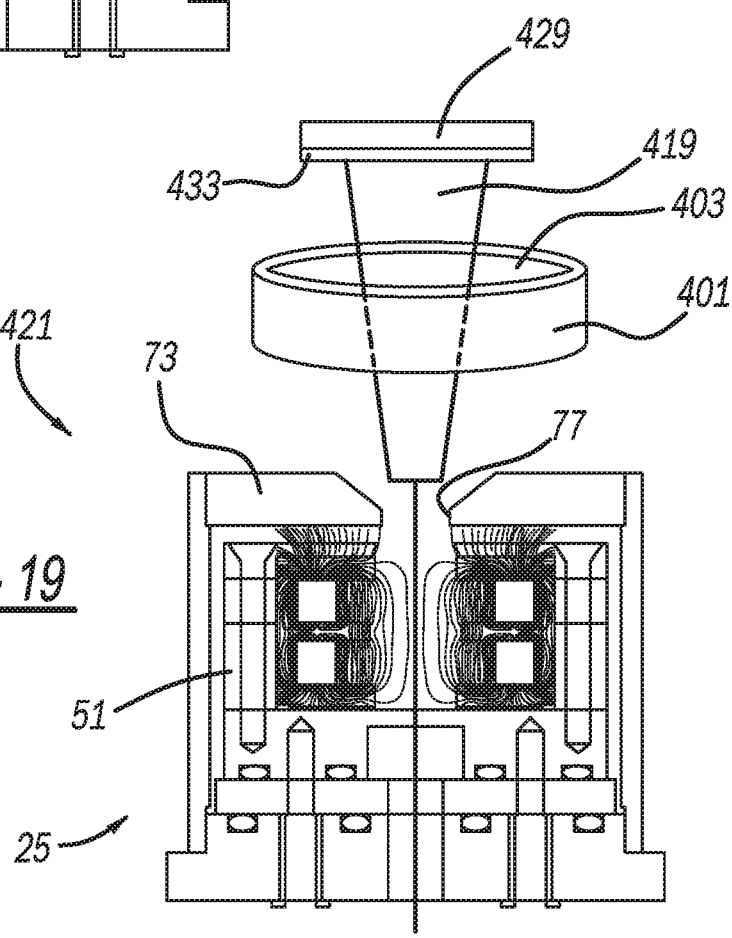
FIG. 19 is a diagrammatic view showing another alternate view of the present plasma or ion source apparatus.

FIG. 19 illustrates a different embodiment single beam plasma or ion source apparatus 421. Anode 51 and cathode 53 of ion source 25 are essentially the same as with the prior embodiments. Additionally, a radio frequency ("RF") induction coil 401 is mounted between, and spaced away from, ion source 25 and a specimen 429. Radio frequency induction coil 401 creates an electromagnetic field during the operation of ion source 25 such that a single source ion beam 419 passes from outlet hole 77 through a hollow center 403 of coil 401 and onto a coating 433 of substrate 429. The RF frequencies are preferably in the range of about 1 MHz to 60 MHz, and more preferably 13.56 MHz.

While radio frequency induction coil 401 is preferably located inside the vacuum chamber along with ion source 25 and specimen 429, they may alternately be configured such that radio frequency induction coil 401 can be on the opposite side of specimen 429 from ion source 25. Radio frequency induction coil 401 will advantageously generate additional ions and densify the ions within ion beam 419. It is also envisioned that the radio frequency induction coil shall assist in shaping ion beam 419 for better control and focusing when depositing coating or films 433 on specimen 429.

Figure 20:
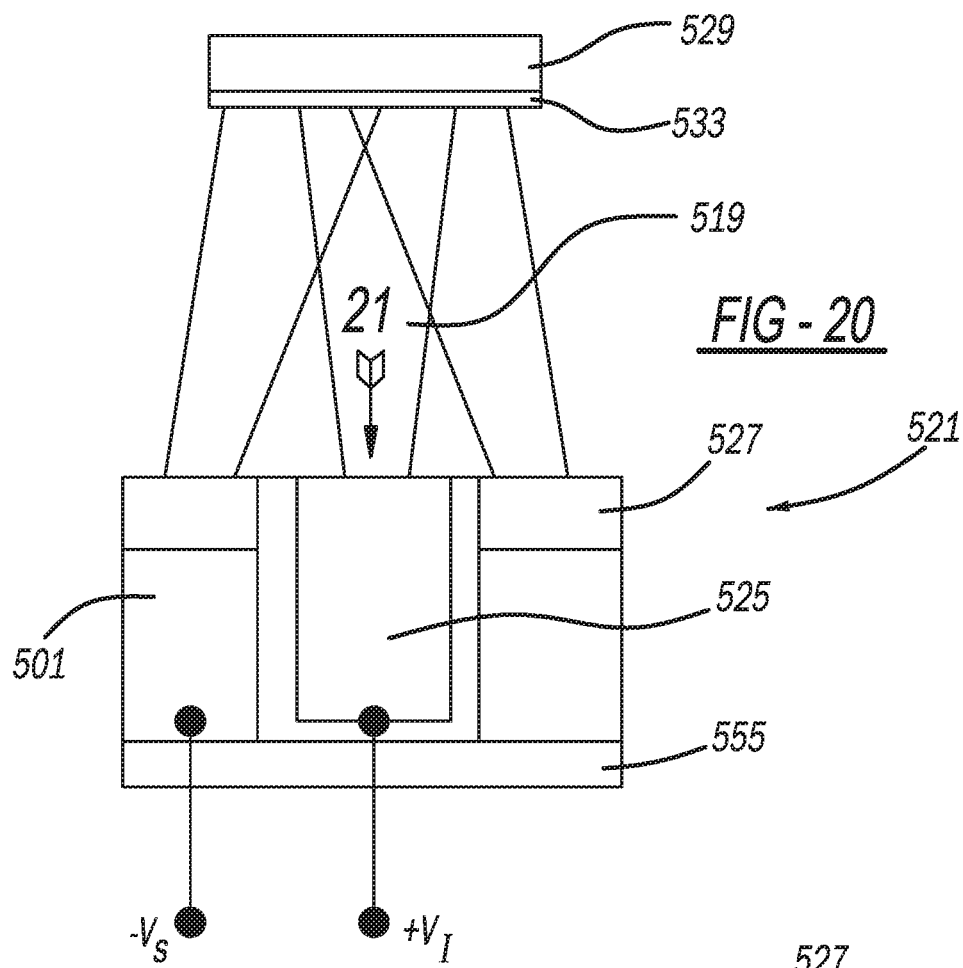
FIG. 20 is a diagrammatic cross-sectional view showing another alternate embodiment of the present plasma or ion source apparatus.
Figure 21:
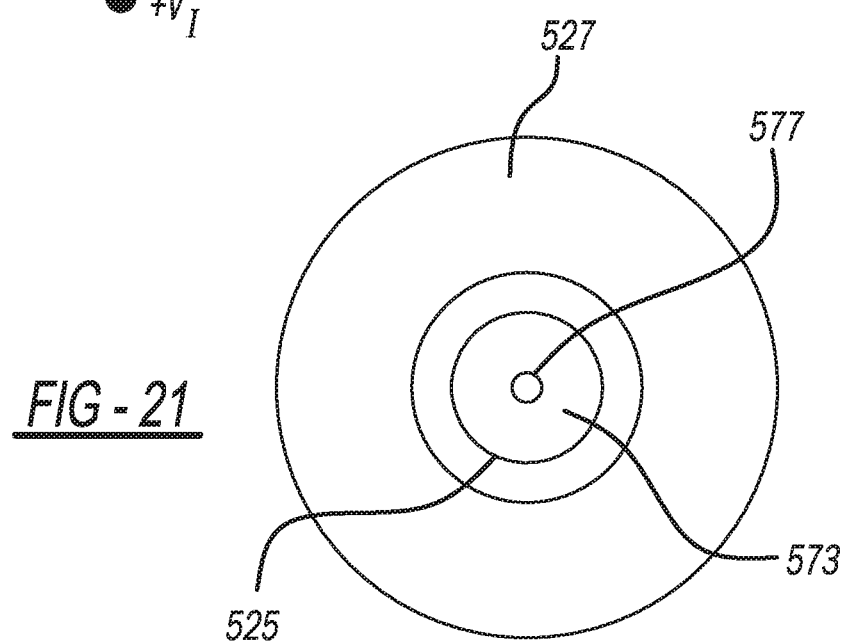
FIG. 21 is an end elevational view, taken in the direction of arrow 21 from FIG. 20, showing the FIG. 20 alternate embodiment plasma or ion source apparatus.

Turning now to FIGS. 20 and 21, another embodiment of a single beam or ion plasma source apparatus 521 includes an ion source 525 and a sputtering target 527. Ion source 525 is similar to that of the prior embodiments disclosed herein. Furthermore, ion source 525 preferably includes a cathode cap 573 with a single and central outlet hole 577 through which a single ion beam 519 is emitted to assist in creation of a coating 533 on a specimen or workpiece 529 within a vacuum chamber.

An annular pedestal 501 of conductive metallic material is mounted upon an insulator 555 and serves to mount an annular shaped sputter target 527 thereupon. Ion source 525 is concentrically and coaxially located within a hollow center of target 527 and pedestal 501. This provides an integrated and simultaneously acting sputtering and ion emission sources which advantageously operate at the same internal vacuum chamber pressure. It is beneficially envisioned that the present integrated and concentric sources can more quickly cover a larger specimen area in a shorter amount of time for both sputtered material deposition and ion emission interactions with the deposited atoms, than would otherwise be achieved with remotely offset ion and target sources. It is further envisioned that the present integrated and concentric sources may provide more complete ion-activated sputtering and in a more uniform manner than with conventional devices. More specifically, the present integrated and coaxial sources are expected to more advantageously be aligned with the specimen thereby achieving a more uniform coating versus offset angled sputtering target locations. A similar principle can be extended to a linearly elongated shape single beam ion source integrated with a sputtering magnetron or other deposition sources.

While various embodiments have been disclosed, it should be appreciated that other variations may be employed. For example, specific magnet and shunt quantities and shapes may be varied although some of the desired benefits may not be realized. Additionally, external body, insulator and base shapes and sizes may be varied, although certain advantages may not be achieved. Furthermore, exemplary target and specimen materials have been identified but other materials may be employed. Moreover, each of the features may be interchanged and intermixed between any and all of the disclosed embodiments, and any of the claims may be multiply dependent on any of the others. While various applications of the single beam plasma or ion sources have been disclosed, using the sources for other applications, such as direct sputtering or etching a target surface, is not to be regarded as a departure from the spirit or the scope of the present invention. Additional changes and modification are not to be regarded as a departure from the spirit or the scope of the present invention.

The invention claimed is:

1. An ion source apparatus comprising:
    (a) an anode comprising at least one magnetic conductor inwardly extending toward an ion emission axis, an open plasma area being located within a hollow central area of the anode;
    (b) a cathode comprising a cap having a single outlet opening therethough, the outlet opening being aligned with the axis;
    (c) magnetic flux lines extending between uppermost and lowermost sections of the at least one magnetic conductor inside the hollow central area of the anode, the magnetic flux lines including a central outward dip adjacent a middle section of the at least one magnetic conductor, the dip of the magnetic flux lines being in the open plasma area, and the dip changing movement of electrons adjacent the dip to increase ionization within a plasma inside the anode; and
    (d) additional magnetic flux lines originating adjacent the uppermost section of the at least one magnetic conductor adjacent the outlet opening, and outwardly radiating therefrom substantially parallel to the ion emission axis and laterally external to the hollow central area of the anode.

2. The apparatus of claim 1, further comprising:
    closed-loop permanent magnets located between multiples of the magnetic conductor in a stacked arrangement; and
    the multiple magnetic conductors being of a closed-loop shape and metallic shunts inwardly projecting toward the axis further than the permanent magnets, the shunts corresponding to the sections.

3. The apparatus of claim 2, wherein the cathode further comprises a body concentrically surrounding the magnets and the shunts, and the cap of the cathode being directly and removeably attached to the body which is laterally spaced away from the anode, and the cap inwardly overhanging the magnets and shunts.

4. The apparatus of claim 1, further comprising a single ion beam, with ions being substantially uniformly distributed around the emission axis when viewed in cross-section, emitted through the outlet opening along the emission axis, and a conductive base enclosing an end of the anode opposite the outlet opening.

5. An ion source apparatus comprising:
(a) an anode comprising at least one magnetic conductor inwardly extending toward an ion emission axis, an open plasma area being located within a hollow central area of the anode;
(b) a cathode comprising a cap having a single outlet opening therethough, the outlet opening being aligned with the axis;
(c) magnetic flux lines extending between uppermost and lowermost sections of the at least one magnetic conductor, the magnetic flux lines including a central outward dip adjacent a middle section of the at least one magnetic conductor, the dip of the magnetic flux lines being in the open plasma area, and the dip changing movement of electrons adjacent the dip to increase ionization within a plasma inside the anode;
(d) a vacuum chamber containing a precursor gas;
(e) a sputter target located in the vacuum chamber receiving the single ion beam; and
(f) the at least one magnetic conductor including at least three spaced apart shunts with the uppermost section being a first of the shunts and the lowermost section being a third of the shunts with the middle section being a second shunt located therebetween.

6. The apparatus of claim 4, wherein the single outlet opening is linearly elongated in a direction substantially perpendicular to the emission axis.

7. The apparatus of claim 4, wherein the single outlet opening is circular with a frustoconical tapered surface on the cap surrounding the opening.

8. The apparatus of claim 1, further comprising a deposition source, a portion of the at least one magnetic conductor being at least partially concentrically located within the deposition source.

9. The apparatus of claim 1, further comprising a specimen, and the anode and cathode emitting a single ion beam with a substantially uniformly distributed ion cross-section around the emission axis, to assist in depositing a thin film of a deposition material on the specimen.

10. The apparatus of claim 1, further comprising a specimen, and the anode and the cathode emitting a single ion beam with a substantially uniformly distributed ion cross-section around the emission axis, to assist in depositing a carbon-based coating on a specimen with the assistance of a carbon-based precursor gas.

11. The apparatus of claim 1, further comprising a radio frequency coil surrounding an ion beam emitted from the anode and the cathode, the coil being longitudinally spaced away from the anode and the cathode.

12. The apparatus of claim 1, further comprising a sputter target, and the anode and the cathode being adapted to cause simultaneously ion emission and sputtering at the same pressure.

13. The apparatus of claim 5, further comprising:
permanent magnets, of a closed-loop shape, located between multiples of the magnetic conductor in a stacked arrangement;
a cylindrical side wall of the anode surrounding all of the shunts and the permanent magnets;
the shunts having a closed-loop shape and inwardly projecting toward the axis further than the permanent magnets; and
the cathode further comprising a body concentrically surrounding the magnets and the shunts, and the cap of the cathode being directly and removeably attached to the body which is laterally spaced away from the anode, and the cap inwardly overhanging the magnets and shunts.

14. The apparatus of claim 5, further comprising:
a single ion beam, with ions being substantially uniformly distributed around the emission axis when viewed in cross-section, emitted through the outlet opening along the emission axis; and
a conductive base enclosing an end of the anode opposite the outlet opening.

15. The apparatus of claim 5, further comprising:
a specimen, and the anode and cathode emitting a single ion beam with a substantially uniformly distributed ion cross-section around the emission axis, to assist in depositing a thin film of a deposition material on the specimen; and
a base of the anode enclosing an end of the anode opposite the outlet opening.

16. The apparatus of claim 5, further comprising:
a specimen, and the anode and the cathode emitting a single ion beam with a substantially uniformly distributed ion cross-section around the emission axis, to assist in depositing a carbon-based coating on a specimen with the assistance of a carbon-based precursor gas; and
an anode base spanning across opposite portions of a curved anode side wall, opposite the outlet opening.

17. The apparatus of claim 5, further comprising a radio frequency coil surrounding an ion beam emitted from the anode and the cathode, the coil being longitudinally spaced away from the anode and the cathode.

18. An ion source apparatus comprising:
(a) an anode comprising magnetic conductors inwardly extending toward an ion emission axis, an open plasma area being located within a hollow central area of the anode;
(b) a cathode comprising a cap having a single outlet opening therethough, the outlet opening being aligned with the axis;
(c) permanent magnets located between the magnetic conductors in a stacked arrangement;
(d) the magnetic conductors comprising metallic shunts inwardly projecting toward the axis further than the permanent magnets; and
(e) magnetic flux lines extending between uppermost and lowermost of the shunts, the magnetic flux lines including a central outward dip adjacent a middle section of the magnetic conductors, the dip of the magnetic flux lines being in the open plasma area, and the dip changing movement of electrons adjacent the dip to increase ionization within a plasma inside the anode.

19. The apparatus of claim 18, wherein the cathode further comprises a body concentrically surrounding the magnets and the shunts, and the cap of the cathode being directly and removeably attached to the body which is laterally spaced away from the anode, and the cap inwardly overhanging the magnets and shunts.

20. The apparatus of claim 18, further comprising:
   a single ion beam, with ions being substantially uniformly distributed around the emission axis when viewed in cross-section, emitted through the outlet opening along the emission axis; and
   the middle section of the magnetic conductors being a middle shunt such that the shunts have a substantially E cross-sectional shape on each side of the ion emission axis.

21. The apparatus of claim 18, further comprising a specimen, and the anode and cathode emitting a single ion beam with a substantially uniformly distributed ion cross-section around the emission axis, to assist in depositing a thin film of a deposition material on the specimen.

22. The apparatus of claim 18, further comprising a specimen, and the anode and the cathode emitting a single ion beam with a substantially uniformly distributed ion cross-section around the emission axis, to assist in depositing a carbon-based coating on a specimen with the assistance of a carbon-based precursor gas.

23. The apparatus of claim 18, further comprising:
   a radio frequency coil surrounding an ion beam emitted from the anode and the cathode;
   the coil being longitudinally spaced away from the anode and the cathode; and
   an anode base enclosing an end of the anode opposite the outlet opening.

24. The apparatus of claim 18, further comprising a sputter target, and the anode and the cathode being adapted to cause simultaneously ion emission and sputtering at the same pressure.

25. An ion source apparatus comprising:
   (a) an anode comprising at least one magnetic conductor inwardly extending toward an ion emission axis, an open plasma area being located within a hollow central area of the anode;
   (b) a cathode comprising a cap having a single outlet opening therethough, the outlet opening being aligned with the axis;
   (c) magnetic flux lines extending between uppermost and lowermost sections of the at least one magnetic conductor, the magnetic flux lines including a central outward dip adjacent a middle section of the at least one magnetic conductor, the dip of the magnetic flux lines being in the open plasma area; and
   (d) the anode further comprising a curved side wall and an enclosed base wall, both of which directly emit an electric field, and the side wall of the anode surrounding the middle section of the at least one magnetic conductor and the dip of the magnetic flux lines.

26. The apparatus of claim 25, further comprising:
   closed-loop permanent magnets located between multiples of the magnetic conductor in a stacked arrangement;
   the multiple magnetic conductors being of a closed-loop shape and metallic shunts inwardly projecting toward the axis further than the permanent magnets, the shunts corresponding to the sections; and
   the side wall of the anode concentrically surrounding all of the permanent magnets and the shunts.

27. The apparatus of claim 26, wherein the cathode further comprises a body concentrically surrounding the magnets and the shunts, and the cap of the cathode being directly and removeably attached to the body which is laterally spaced away from the anode, and the cap inwardly overhanging the magnets and shunts.

28. The apparatus of claim 25, wherein the at least one magnetic conductor comprises at least three annular magnetic shunts inwardly projecting from the cylindrical side wall of the anode defining a substantially E cross-sectional shape on each side of the ion emission axis, the cylindrical side wall of the anode concentrically surrounding the magnetic shunts.

29. The apparatus of claim 25, further comprising a single ion beam, with ions being substantially uniformly distributed around the emission axis when viewed in cross-section, emitted through the outlet opening along the emission axis.

30. The apparatus of claim 25, further comprising a specimen, and the anode and cathode emitting a single ion beam with a substantially uniformly distributed ion cross-section around the emission axis, to assist in depositing a thin film of a deposition material on the specimen.

31. The apparatus of claim 25, further comprising a specimen, and the anode and the cathode emitting a single ion beam with a substantially uniformly distributed ion cross-section around the emission axis, to assist in depositing a carbon-based coating on a specimen with the assistance of a carbon-based precursor gas.

32. The apparatus of claim 25, further comprising a radio frequency coil surrounding an ion beam emitted from the anode and the cathode, the coil being longitudinally spaced away from the anode and the cathode.

33. The apparatus of claim 25, further comprising a sputter target, and the anode and the cathode being adapted to cause simultaneously ion emission and sputtering at the same pressure.

* * * * *